United States Patent
Hoang

(10) Patent No.: US 6,475,828 B1
(45) Date of Patent: Nov. 5, 2002

(54) METHOD OF USING BOTH A NON-FILLED FLUX UNDERFILL AND A FILLED FLUX UNDERFILL TO MANUFACTURE A FLIP-CHIP

(75) Inventor: Lan Hoang, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/437,559

(22) Filed: Nov. 10, 1999

(51) Int. Cl.⁷ ............................................... H01L 21/48
(52) U.S. Cl. .................... 438/108; 438/613; 228/180.22
(58) Field of Search ................................ 438/108, 198, 438/124, 126, 127, 597, 612, 125, 613, 106, 107; 228/180.21, 180.22; 257/737, 738, 778, 779, 780, 787

(56) References Cited

U.S. PATENT DOCUMENTS

| | | | | |
|---|---|---|---|---|
| 5,376,588 A | | 12/1994 | Pendse | 438/193 |
| 5,385,869 A | * | 1/1995 | Liu et al. | 438/126 |
| 5,696,027 A | | 12/1997 | Crane, Jr. | 438/612 |
| 5,880,530 A | * | 3/1999 | Mashimoto et al. | 257/783 |
| 5,952,726 A | | 9/1999 | Liang | 257/778 |
| 5,985,043 A | * | 11/1999 | Zhou et al. | 148/24 |
| 5,988,485 A | * | 11/1999 | Master et al. | 228/180.22 |
| 5,998,242 A | * | 12/1999 | Kirkpatrick et al. | 438/127 |
| 6,048,753 A | | 4/2000 | Farnworth | 438/111 |
| 6,064,113 A | | 5/2000 | Kirkman | 257/691 |
| 6,103,549 A | * | 8/2000 | Master et al. | 438/106 |
| 6,111,756 A | | 8/2000 | Moresco | 361/735 |
| 6,117,759 A | * | 9/2000 | Greer et al. | 438/616 |
| 6,121,689 A | * | 9/2000 | Capote et al. | 257/783 |
| 6,198,635 B1 | | 3/2001 | Shenoy et al. | 361/760 |
| 6,234,379 B1 | * | 5/2001 | Donges | 228/207 |

FOREIGN PATENT DOCUMENTS

| | | | |
|---|---|---|---|
| EP | WO 01/88959 | * | 11/2001 |
| EP | WO 02/24391 | * | 3/2002 |

OTHER PUBLICATIONS

Kulojarvi et al., "High Volume Capable Direct Chip Attachment Methods", 1999 Electronic Components and Technology Conference, pp. 441–445.*

Smith et al., "A reliability and Failure Mode Analysis of No Flow Underfill Materials for Low Cost Flip Chip", 2000 Electronic Components and Technology Conference, pp. 1719–1730.*

DeBarros et al., "The No–Flow Fluxing Underfill Adhesive For Low Cost, High Reliability Flip Chip Assembly", 1999 Electronic Components and Technology Conference, pp. 955–960.*

(List continued on next page.)

*Primary Examiner*—David L. Talbott
*Assistant Examiner*—Alonzo Chambliss
(74) *Attorney, Agent, or Firm*—Luedeka, Neely & Graham, PC

(57) ABSTRACT

A method is disclosed for applying underfill to a flip-chip package comprising integrated circuit die and a substrate. First, a first non-filled no flow flux-underfill is applied to a plurality of solder bumps disposed on an active surface of the integrated circuit die. Next, the integrated circuit die is placed on the substrate such that the solder bumps align with corresponding bond pads on the substrate, thereby creating an assembly. A second filler-loaded no flow flux-underfill is then dispensed on a side of the substrate such that the second filler-loaded no flow flux-underfill flows by capillary action between the die and substrate to fill a gap therebetween. Finally, the assembly is passed through a furnace such that both the first non-filled no flow flux-underfill and the second filled no flow flux-underfill are cured, and such that the solder bumps are reflowed.

5 Claims, 4 Drawing Sheets

OTHER PUBLICATIONS wong et al., "Hish Performance No Flow Underfills for Low–Cost Flip–Chip Applications", 1997 Electronic Components and Technology conference, pp. 850–858.*

Shi et al., "Development of the Wafer Level compressive–Flow Underfill Encapsulant", 1999 International Symposium on Advanced Packaging Materials, pp. 337–343.*

Shi et al., "Recent Advances in the Development of No–Flow Underfill Encapsulants—A Practical approach towards the Actual Manufacturing Application", 1999 Electronic Components and Technology Conference, pp. 770–776.*

Shi et al., "Development of the Wafer Level compressive–flow Underfill Process and Its Involved Materials", 1999 Transactions of Electronics Packaging Manufacturing, vol. 22, No. 4, Oct. 1999, pp. 274–281.*

* cited by examiner

METHOD OF USING BOTH A NON-FILLED FLUX UNDERFILL AND A FILLED FLUX UNDERFILL TO MANUFACTURE A FLIP-CHIP

BACKGROUND OF THE INVENTION

1. Field of the Invention

This invention relates to packages for integrated circuits and more particularly to a method for dispensing underfill during the manufacture of a flip-chip package.

2. Description of the Related Art

A flip-chip package comprises an integrated circuit die whose active surface (i.e. the surface with bond pads) faces bond pads on a substrate. The bond pads on the integrated circuit are connected with corresponding bond pads on the substrate through solder bumps, which may be formed on the bond pads of the die. Underfill is dispensed between the solder bumps and the substrate to improve the solder fatigue life of the solder bumps.

According to a first conventional method, the die is first "flipped" on to the substrate such that the solder bumps contact the corresponding bond pads on the substrate. The solder balls may then be reflowed. Underfill epoxy may then be dispensed between the die and the substrate to fill the gaps between the solder balls. A typical method involves dispensing the underfill from one side of the substrate to fill the other side; capillary action pulls the material across the substrate through the gaps between the solder bumps.

After reflow, the bump height is less than the original bump height. In a typical flip chip, the bump height may decrease by 25 um, which in turn decreases the gap height between a solder mask (which is overlaid on the substrate) and the die. This reduction in the gap between a chip and a substrate increases the difficulty of dispensing the underfill; specifically, a smaller gap impedes the flow of underfill between the chip and the substrate and thereby increases the amount of voiding in the underfill material. Voiding in the underfill results in decreased reliability of the attachment of die to substrate under conditions of stress, such as temperature cycling and moisture preconditioning. Voids also allow for potential electrical shorts between adjacent bumps.

Solder masks have other drawbacks. For example, dimensional tolerances of the solder mask openings for the pads on the substrate can limit the density (pitch) between solder balls due to substrate manufacturing defects and defects involved in the assembly of the flip chip. These defects lower manufacturing yields and increase the cost of the substrate and the cost of flip chip assembly.

Alternatively, according to a second conventional method, a "no flow flux-underfill" may be used as an underfill. In this case, an underfill with a fluxing component is dispensed on the substrate and the die is then "flipped" onto the substrate as previously described; since the underfill is dispensed before the attachment of the die to the substrate, the second conventional method avoids the problems of dispensing underfill between the gap of a die already attached to a substrate. The resulting assembly is then run through a reflow furnace to reflow the solder balls and cure the flux-underfill material. The major drawback to the flux-underfill method is that when the flux is loaded with filler, the solder does not properly reflow. On the other hand, when no fillers are used, the flux has high CTE and low Tg, which results in poor reliability, especially in temperature cycling tests.

As the pitch of solder bumps continues to decrease (i.e. the density of bond pads on dies increases), and therefore the size of solder bumps decreases, gaps between substrates and dies will continue to decrease. Therefore, it will become increasingly important to overcome the aforementioned limitations in the above mentioned underfill dispense techniques.

SUMMARY OF THE INVENTION

The present invention comprises a method for applying underfill to a flip-chip package comprising an integrated circuit die and a substrate. The method comprises the following steps. First, a first non-filled no flow flux-underfill is applied to a plurality of solder bumps disposed on an active surface of the integrated circuit die. Next, the integrated circuit die is placed on the substrate such that the solder bumps align with corresponding bond pads on the substrate, thereby creating an assembly. A second filler-loaded no flow flux-underfill is then dispensed on a side of the substrate such that the second filler-loaded no flow flux-underfill flows by capillary action between the die and substrate to fill a gap therebetween. Finally, the assembly is passed through a furnace such that both the first non-filled no flow flux-underfill and the second filled no flow flux-underfill are cured, and such that the solder bumps are reflowed.

The above described method has the advantages of using a flux as an underfill without the previously described disadvantages associated with the second conventional method.

BRIEF DESCRIPTION OF THE DRAWINGS

Other objects and advantages of the invention will become apparent upon reading the following detailed description and upon reference to the accompanying drawings in which.

Figure 1A:
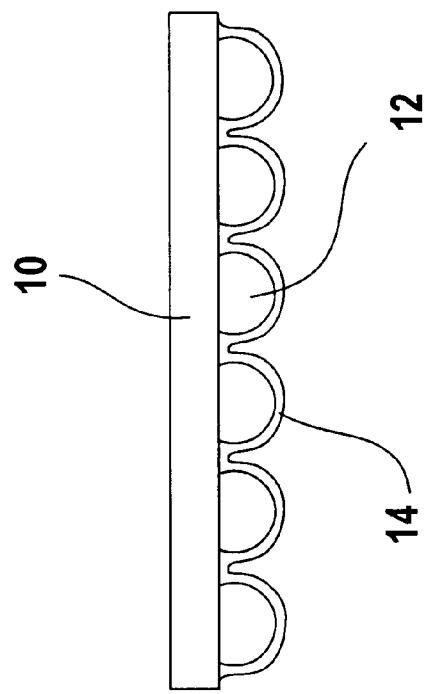
FIGS. 1a through 1d diagrammatically illustrate a method of dispensing underfill according to the sent invention.
Figure 1A:
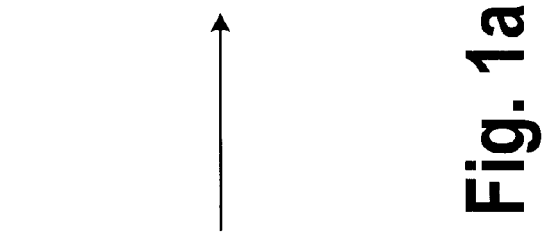
Figure 1A:
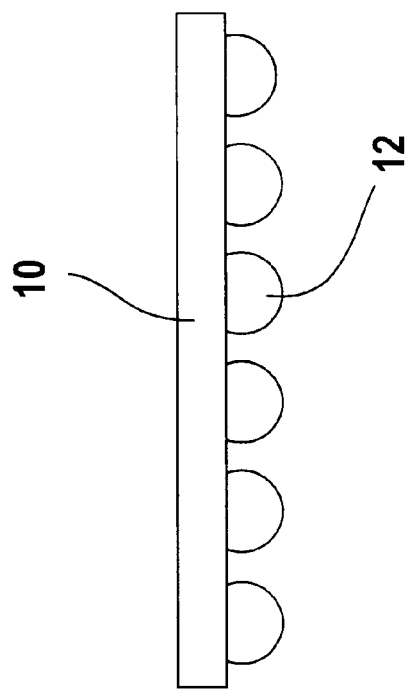

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIGS. 1a through 1d diagrammatically illustrate a method of dispensing underfill according to the present invention. FIG. 1a, shows a die 10 with solder bumps 12 on the active surface thereof. A first material 14 that is preferably a non-filled "no flow flux-underfill" (preferably obtained from Dexter Electronic Materials of La Puente, Calif.) is placed on the solder bumps 12 by any of a number of well known methods or future methods. For example, the first material 14 may be directly applied to the solder bumps 12 (such as by drum fluxer or otherwise dipping or spraying) or the first material 14 may be indirectly applied to the solder bumps 12 by first applying the first material 14 to a plurality of bond pads 16 on a substrate 18 (see FIG. 1b). Alternatively, instead of using a flux-underfill, the first material 14 may be a standard flux (such as a flux that may be obtained from Kester Solder Division, Litton Systems, Inc., Des Plaines, Ill.).

In an alternate embodiment, a fluxless method (e.g. plasma treatment) may be used in place of the step of applying the first material 14.

Figure 1B:
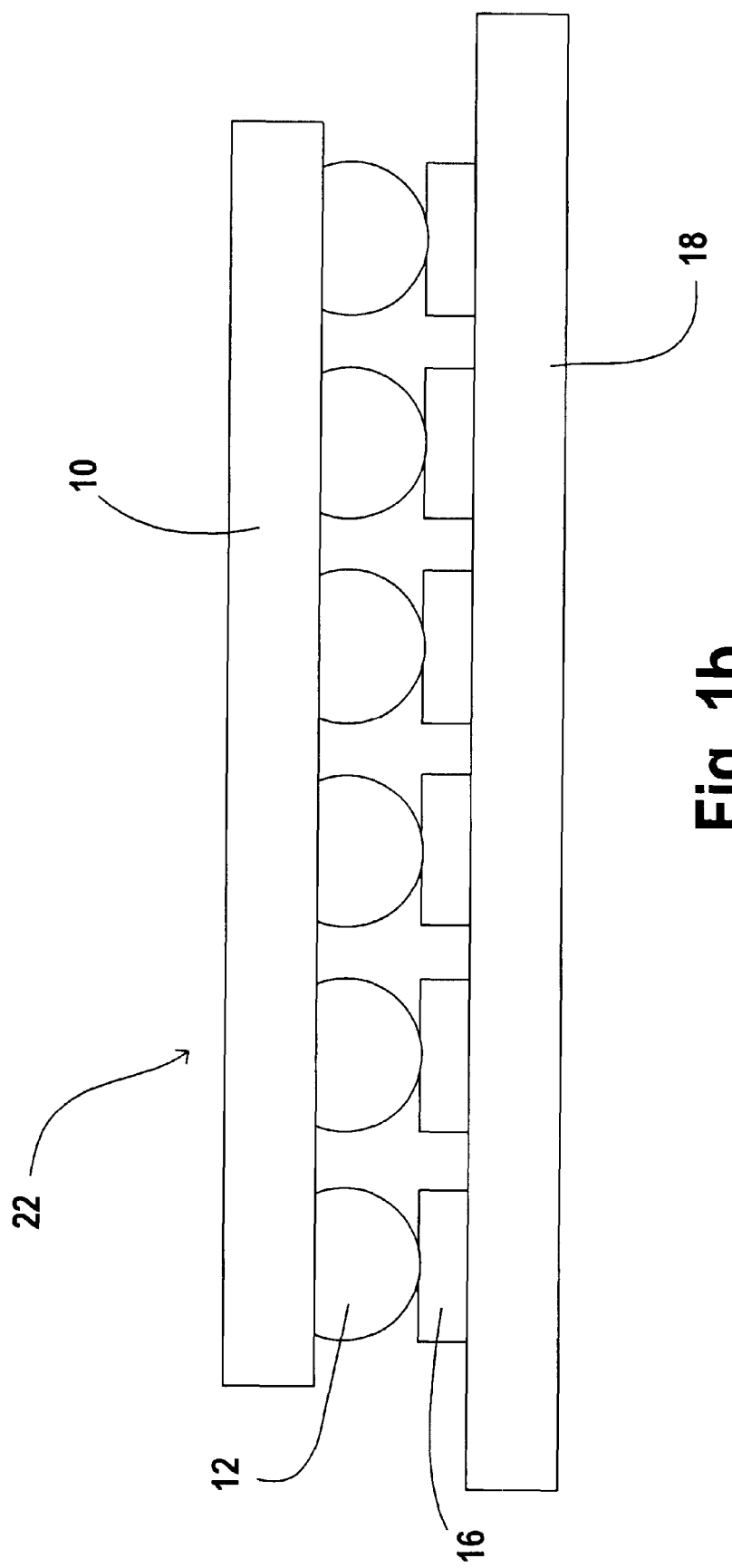
Figure 1C:
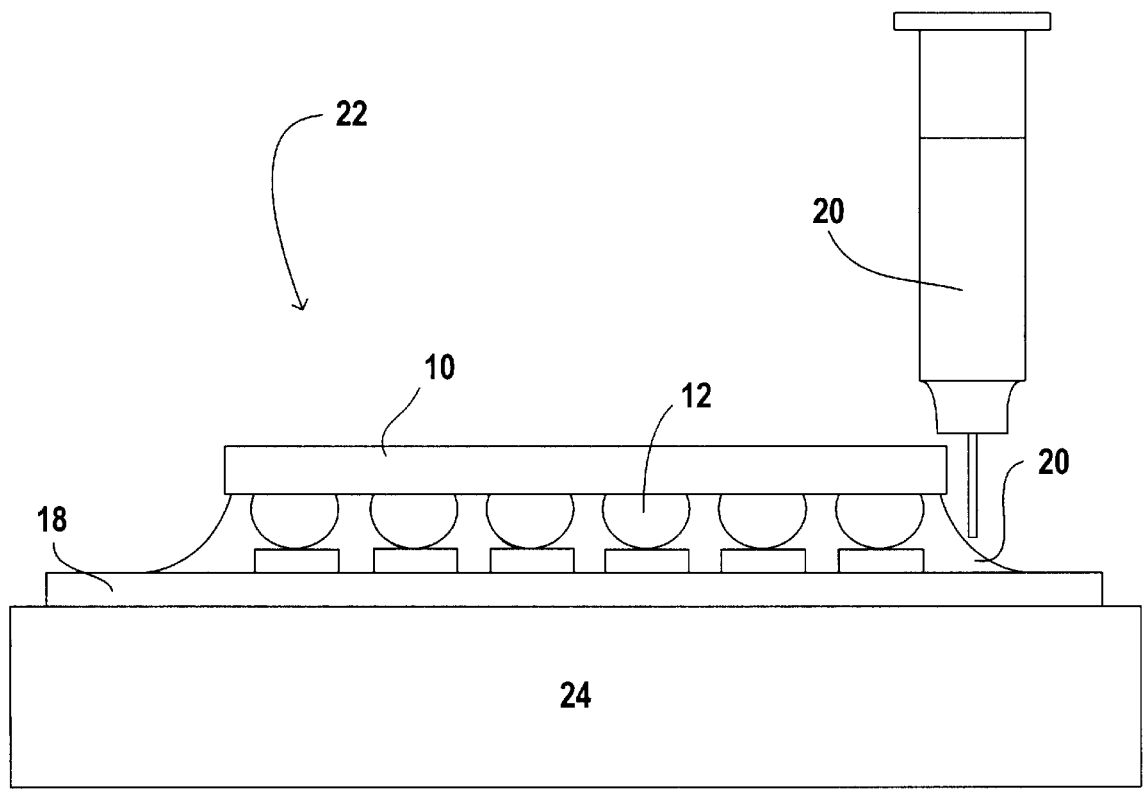

As shown in FIG. 1b, the die 10 is placed on the substrate 18 such that the solder bumps 12 align on the die 10 with corresponding bond pads 16 on the substrate 18, thereby creating an assembly 22. As shown in FIG. 1c, a primary underfill material 20, preferably a filler-loaded "no flow flux-underfill" that may be obtained from Dexter Electronic Materials of La Puente, Calif. is dispensed on a side of the substrate 18. The assembly 22 is placed on a heater block 24 which is typically heated to a temperature within the range of 70 degrees Celsius to 110 degrees Celsius. The filler-loaded "no flow flux-underfill" is preferably weighted with a filler at 40%–60% weight. The primaryunderfill 20 flows by capillary action between the die 10 and substrate 18 to fill the gap therebetween. The primary underfill may also be a standard underfill (i.e. one hat does not include any fluxing components).

Figure 1D:
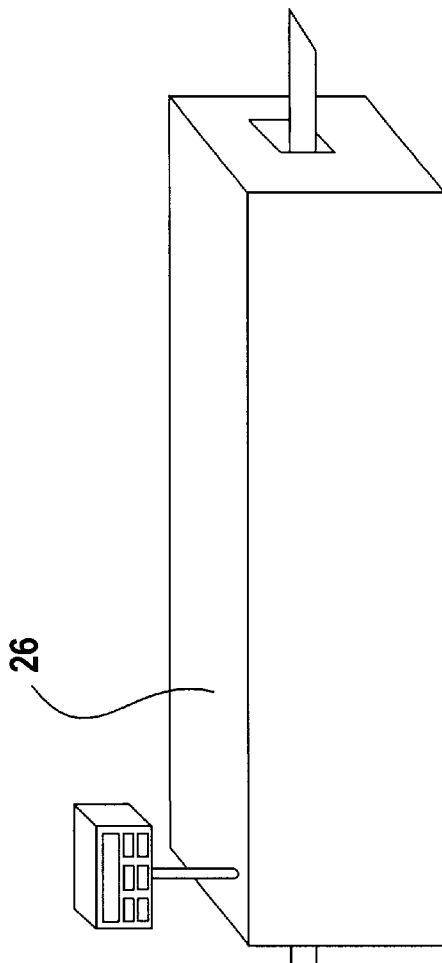
Figure 1D:
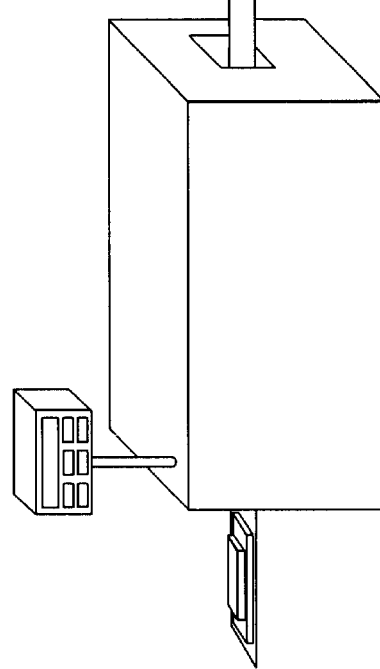

As shown in FIG. 1d, the assembly 22 is then sent through a reflow furnace 26 to reflow the solder bumps 12 and to cure the first material 14 and the primary underfill 20.

Conclusion

Numerous variations and modifications will become apparent to those skilled in the art once the above disclosure is fully appreciated. It is intended that the following claims be interpreted to embrace all such variations and modifications.

What is claimed is:

1. A method for applying underfill to a flip-chip package comprising an integrated circuit die and a substrate, the method comprising the steps of:

placing a first non-filled no-flow flux-underfill on a plurality of solder bumps located on the integrated circuit die, placing the integrated circuit die on the substrate such that the plurality of solder bumps are aligned both with corresponding bond pads on the substrate and with corresponding bond pads on the integrated circuit die, thereby creating an assembly of the flip-chip package, and forming a gap between the integrated circuit die and the substrate, dispensing a second filler loaded no-flow flux-underfill on a side of the substrate such that the second filler loaded no-flow flux-underfill flows by capillary action between the integrated circuit die and the substrate to fill the gap therebetween, and heating the assembly such that both the first non-filled no flow flux-underfill and the second filler loaded no-flow flux-underfill are cured, and such that the solder bumps are reflowed.

2. The method of claim 1 wherein the plurality of solder bumps are formed on an active surface of the die.

3. The method of claim 1 wherein the step of applying the first non-filled no flow flux-underfill is performed by directly applying the first non-filled no flow flux-underfill to the plurality of solder bumps.

4. The method of claim 1 wherein the step of applying the first non-filled no flow flux-underfill is performed by applying the first non-filled no flow flux-underfill to the substrate such that the first non-filled no flow flux-underfill is brought into contact with the plurality of solder bumps when the integrated circuit die is placed on the substrate.

5. The method of claim 1 wherein the step of heating the assembly includes the step of passing the assembly through a reflow furnace.

* * * * *